US010404221B2

(12) United States Patent
Jones et al.

(10) Patent No.: US 10,404,221 B2
(45) Date of Patent: Sep. 3, 2019

(54) AMPLIFIER CIRCUIT WITH REDUCED FEEDFORWARD CURRENT

(71) Applicant: THX Ltd., San Francisco, CA (US)

(72) Inventors: Owen Jones, Ipswich (GB); Lawrence R. Fincham, Santa Rosa, CA (US); Andrew Mason, Mono (CA)

(73) Assignee: THX Ltd., San Francisco, CA (US)

( * ) Notice: Subject to any disclaimer, the term of this patent is extended or adjusted under 35 U.S.C. 154(b) by 5 days.

(21) Appl. No.: 15/799,770

(22) Filed: Oct. 31, 2017

(65) Prior Publication Data

US 2018/0123531 A1   May 3, 2018

Related U.S. Application Data

(60) Provisional application No. 62/415,286, filed on Oct. 31, 2016.

(51) Int. Cl.
| | |
|---|---|
| *H03F 3/45* | (2006.01) |
| *H03F 1/34* | (2006.01) |
| *H03F 3/183* | (2006.01) |
| *H03F 3/60* | (2006.01) |
| *H03F 3/187* | (2006.01) |

(52) U.S. Cl.
CPC .............. *H03F 1/34* (2013.01); *H03F 3/183* (2013.01); *H03F 3/187* (2013.01); *H03F 3/45475* (2013.01); *H03F 3/605* (2013.01); *H03F 2200/03* (2013.01); *H03F 2200/135* (2013.01); *H03F 2203/45118* (2013.01); *H03F 2203/45138* (2013.01); *H03F 2203/45148* (2013.01)

(58) Field of Classification Search
CPC ........ H03F 1/34; H03F 3/183; H03F 3/45475; H03F 3/605; H03F 1/08; H03F 1/24; H03F 1/36; H03F 3/52; H03F 2200/36; H03F 3/45; H03F 3/45071; H03F 3/45183; H03F 1/083
USPC .................................. 330/98, 107, 109, 260
See application file for complete search history.

(56) References Cited

U.S. PATENT DOCUMENTS

| | | | | |
|---|---|---|---|---|
| 4,468,627 A | * | 8/1984 | Fushiki | ................... H03F 1/083 330/107 |
| 4,523,152 A | * | 6/1985 | Garde | ................... H03F 3/2171 330/151 |
| 5,705,951 A | * | 1/1998 | Håkansson | ............. H03F 3/187 330/100 |

(Continued)

*Primary Examiner* — Khanh V Nguyen
(74) *Attorney, Agent, or Firm* — Ben J. Yorks; Irell & Manella LLP

(57) ABSTRACT

An amplifier circuit that includes a first amplifier that has a first input that receives an input signal, a second input and an output. The amplifier circuit also includes a second amplifier that has a first input that is coupled to the output of said the amplifier and a second input. The circuit further includes a first impedance network Z1, a second impedance network Z2, a third impedance network Z3 and a fourth impedance network Z4. The first impedance network Z1 is coupled to a load and the second input of the second amplifier, the second impedance Z2 is connected the output of the first amplifier and the second input of the first amplifier, the third impedance Z3 is connected to the output of the first amplifier and the load, the fourth impedance Z4 is connected the output of the second amplifier and the second input of said first amplifier.

5 Claims, 3 Drawing Sheets

(56) References Cited

U.S. PATENT DOCUMENTS

| | | | | |
|---|---|---|---|---|
| 6,201,442 B1* | 3/2001 | James | ............... | H03F 1/083 330/107 |
| 8,421,531 B2* | 4/2013 | Jones | ............... | H03F 1/0205 330/98 |
| 2015/0270815 A1* | 9/2015 | Yamauchi | ............ | H03F 3/3028 330/291 |

* cited by examiner

AMPLIFIER CIRCUIT WITH REDUCED FEEDFORWARD CURRENT

RELATED APPLICATION INFORMATION

This application claims the benefit of U.S. Provisional Application Ser. No. 62/415,286 filed on Oct. 31, 2016.

BACKGROUND OF THE INVENTION

1. Field of the Invention

The subject matter disclosed generally relates to electrical amplifiers.

2. Background Information

U.S. Pat. No. 8,004,355 discloses various low dissipation, low distortion amplifiers. FIG. 1 shows a representative amplifier circuit from the '355 patent. The amplifier includes a gain/driver amplifier 10 and an output amplifier 12. The amplifier also includes passive impedance networks 12 ($Z_g$), 16 ($Z_5$), 18 ($Z_4$), 20 ($Z_2$), 22 ($Z_1$) and 24 ($Z_3$) that are connected in part to create a feedforward network. The purpose of this feedforward network is to add a correction signal to the output that (ideally) cancels the distortion introduced by the output stage. The feedforward network has an impact on the amplifier drive stage. Not only does the feedforward network carry a distortion correction current but it also carries, by the nature of the circuit that ensures correct distortion cancellation, a significant component of a linear output current. This linear portion may be 100-200 times lower than the main output current but this still represents a significant load upon the driver stage. Not only does the driver stage have to source this linear current hence increasing its quiescent current requirement, the loading by the feedforward network may compromise the stability of the driver stage. Furthermore, the loading of the drive stage increases its inherent distortion.

In the circuit arrangement shown in FIG. 1, $Z_1$ is a resistor $R_1$, $Z_2$ is a capacitor $C_2$, $Z_3$ is a parallel combination of resistor $R_3$ and capacitor $C_3$, and $Z_4$ is a series combination of resistor $R_4$ and capacitor $C_4$. Provided that the bridge is balanced, i.e.

$$\frac{Z_2}{Z_4} = \frac{Z_3}{Z_1}$$

then any distortion in the output stage B is eliminated from the output signal $V_L$. This arrangement works well but has two significant limitations: First, the output resistance is $Z_1 // Z_3$, and given that $Z_1$ is typically a resistor in the range of 0R1 to 0R3, the high frequency output resistance is relatively high (the low frequency closed loop output resistance is reduced by the presence of the feedback loop formed by $Z_5$). Second, the error current that has to be supplied by the output stage of amplifier block 10 is relatively large. $Z_1$ carries most of the output current, causing a significant voltage drop across it. This voltage drop is impressed across $Z_3$, along with any gain loss in stage 12 and the current required to support this voltage drop across $Z_3$ must be supplied by amplifier 10.

The equations detailed above are approximate and are dependent upon the performance of amplifier 10. However, the characteristics of amplifier 10 can at least partially be incorporated into the balance equation and compensated for by appropriate alterations in impedance elements $Z_1$ to $Z_4$. Limitations that can be compensated for by adjustment of the bridge values include gain-bandwidth limitations of amplifier 10 as well as non-zero output impedance.

BRIEF SUMMARY OF THE INVENTION

An amplifier circuit that includes a first amplifier that has a first input that receives an input signal, a second input and an output. The amplifier circuit also includes a second amplifier that has a first input that is coupled to the output of the first amplifier and a second input. The circuit further includes a first impedance network Z1, a second impedance network Z2, a third impedance network Z3 and a fourth impedance network Z4. The first impedance network Z1 is coupled to a load and the second input of the second amplifier, the second impedance Z2 is connected the output of the first amplifier and the second input of the first amplifier, the third impedance Z3 is connected to the output of the first amplifier and the load, the fourth impedance Z4 is connected the output of the second amplifier and the second input of said first amplifier.

DETAILED DESCRIPTION

Disclosed is an amplifier circuit that includes a first amplifier that has a first input that receives an input signal, a second input and an output. The amplifier circuit also includes a second amplifier that has a first input that is coupled to the output of the first amplifier and a second input. The circuit further includes a first impedance network Z1, a second impedance network Z2, a third impedance network Z3 and a fourth impedance network Z4. The first impedance network Z1 is coupled to a load and the second input of the second amplifier, the second impedance Z2 is connected the output of the first amplifier and the second input of the first amplifier, the third impedance Z3 is connected to the output of the first amplifier and the load, the fourth impedance Z4 is connected the output of the second amplifier and the second input of said first amplifier. With this configuration of the amplifier circuit, the linear current can be made arbitrarily small and the loading on the driver stage can be significantly reduced. Thus the dissipation in the driver stage is reduced, as is distortion and stability is improved.

Figure 1:
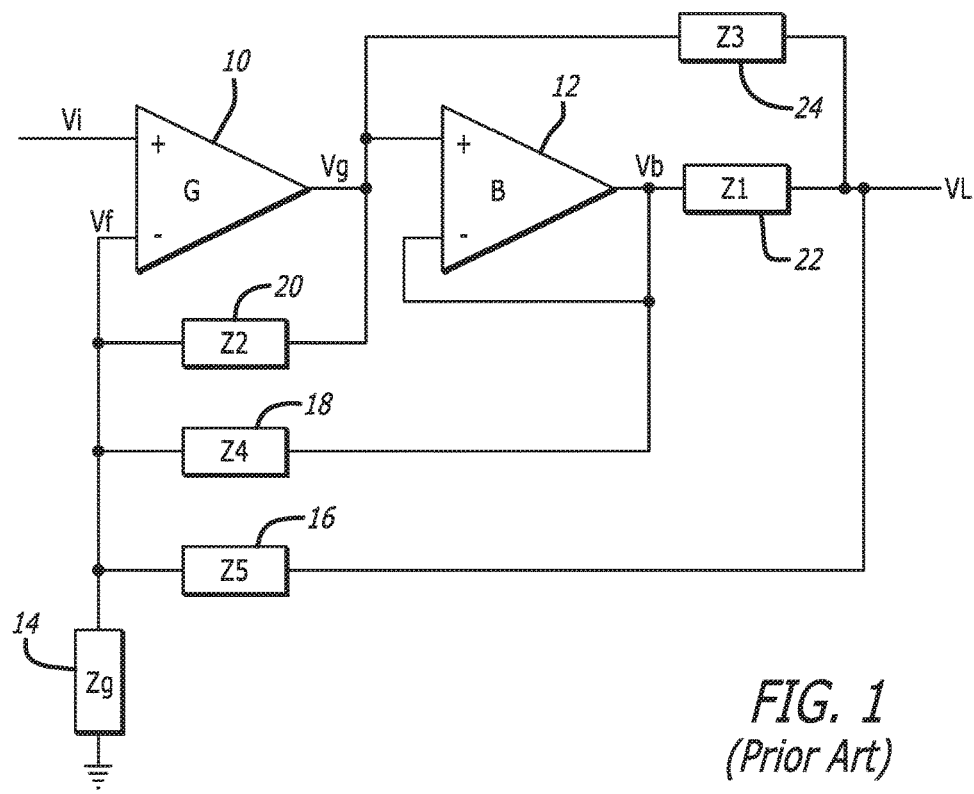
FIG. 1 is a schematic of an amplifier circuit of the prior art.
Figure 2:
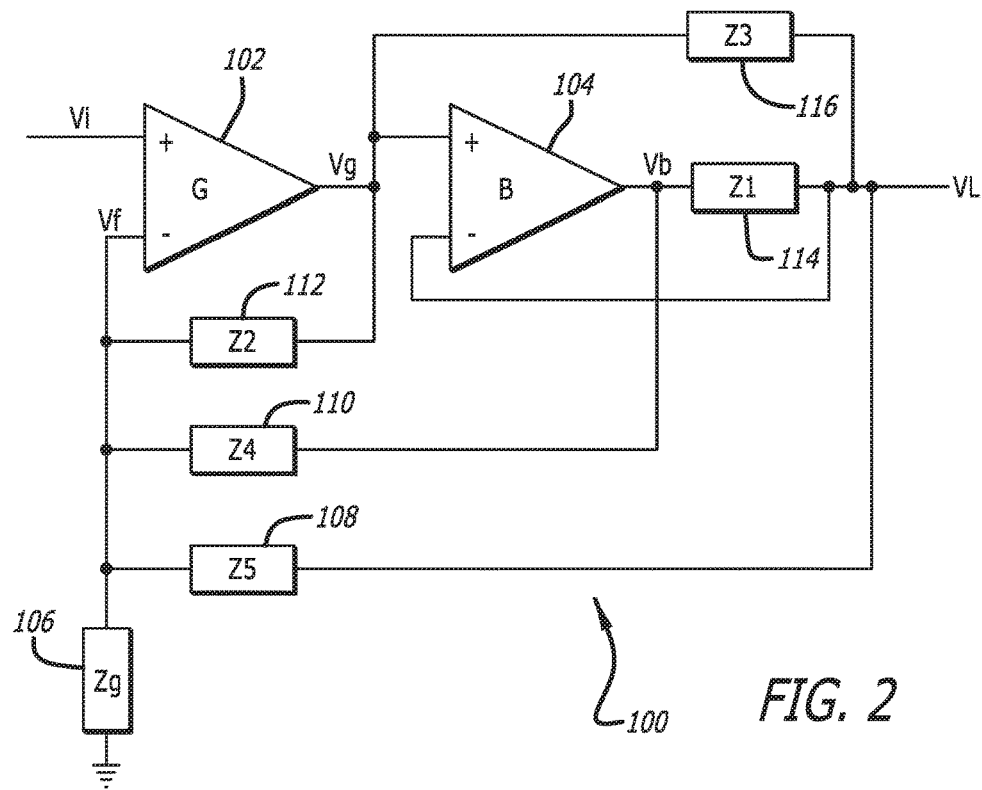
FIG. 2 is a schematic of an embodiment of an amplifier circuit of the present invention.

Referring to the drawings more particularly by reference numbers, FIG. 2 shows an embodiment of an amplifier circuit 100 of the present invention. The amplifier 100 includes a gain/driver amplifier 102 and an output amplifier 104. The amplifier 102 includes an input that receives an input signal $V_i$ and a second input that receives feedback $V_f$. The amplifer 102 provides an output $V_g$ to an input of the amplifier 104. Amplifier 104 provides an output $V_b$. The amplifier circuit 100 also includes passive impedance networks 106 ($Z_g$), 108 $Z_5$), 110 ($Z_4$), 112 ($Z_2$), 114 ($Z_1$) and 116 ($Z_3$). The impedance network 114 ($Z_1$) is connected to a load $V_L$. The unity gain output stage shown in FIG. 1 is reconfigured to encompass the bridge element $Z_1$. The rest of the bridge connections remain unaltered from the prior art circuit shown in FIG. 1 of the '355 patent, which is incorporated by reference. This reconnection ensures that for values of B significantly greater than unity the feedback loop around the output stage now ensures that there is little voltage difference impressed across $Z_3$ and therefore little current through it.

It would appear by inspection that the bridge balance should be unaltered and that the distortion reduction brought about by its employment is also unaffected, as the take-off point for the feedback through $Z_4$ is the same as before.

The action of the bridge connection scheme is to make the output voltage $V_L$ independent of output stage B and any distortion introduced by it at point $V_b$. Thus the change in voltage $V_b$ caused by the reconnection of the inverting input should have no effect upon bridge balance and output distortion cancellation.

An analysis of the amplifier operation produces the following equation:

$$\frac{V_L}{Z_L} = \frac{B(Z_2+Z_4)}{Z_1(BZ_2+Z_4)}V_{in} - \left(\frac{(BZ_2+[1+B]Z_4)}{Z_1(Z_4+BZ_2)}+\frac{(Z_1+Z_L)}{Z_L(Z_1+BZ_3)}\right)V_L + \left(\frac{Z_4}{Z_1(Z_4+BZ_2)}-\frac{1}{Z_1+BZ_3}\right)V_d$$

Where $V_d$ is a distortion term appearing at the output of amplifier 104. This equation can be rearranged to give $V_L$ in terms of $V_{in}$ and $V_d$ but first, it can be seen that the $V_d$ term has two arguments of opposite sign. If we therefore make these equal, the distortion term is eliminated from the amplifier output voltage $V_L$. So for distortion elimination:

$$\frac{Z_4}{Z_1(Z_4+BZ_2)} = \frac{1}{Z_1+BZ_3}$$

which simplifies down to:

$$\frac{Z_2}{Z_4} = \frac{Z_3}{Z_1}$$

This is the same balance equation as described in the '355 patent. The reconnection of output stage B has had no effect upon the balance, nor has the value of gain B.

The output impedance is given by:

$$Z_o = \frac{Z_1(BZ_2+Z_4)}{BZ_2+(1+B)Z_4+Z_4}$$

Since $Z_2 \gg Z_4$ within the audio band:

$$Z_o \approx Z_1$$

This result is close to that of the standard bridge connection output impedance of $Z_1//Z_3$. Thus the output impedance is not reduced by this reconnection of the output stage.

The incorporation of bridge element $Z_1$ into the feedback loop of output stage 104 means that the current through $Z_3$ should be reduced. The feedforward current $I_3$ is given by:

$$I_3 = \frac{(Z_1+Z_L)}{Z_L} \cdot \frac{1}{Z_1+BZ_3}V_L - \frac{1}{Z_1+BZ_3}V_d$$

Setting $V_d$ to zero to obtain the linear portion of current we obtain:

$$I_3 = \frac{(Z_1+Z_L)}{Z_L} \cdot \frac{1}{Z_1+BZ_3}V_L$$

The feedforward current for the configuration in the '355 patent—$I'_3$—is:

$$I'_3 = \frac{Z_1}{(Z_1+Z_3)Z_L}V_L$$

Dividing the two gives:

$$\frac{I_3}{I'_3} = \frac{(Z_1+Z_L)}{Z_L} \cdot \frac{1}{Z_1+BZ_3} \cdot \frac{(Z_1+Z_3)Z_L}{Z_1}$$

Now, $Z_3 \gg Z_1$ and $Z_L \gg Z_1$ so the equation reduces to:

$$\frac{I_3}{I'_3} = \frac{Z_L}{BZ_1}$$

So the linear error current $I_3$ is reduced by the factor $Z_L/BZ_1$ or in other words, $B > Z_L/Z_1$ to bring about a reduction in linear error current $I_3$.

Figure 3:
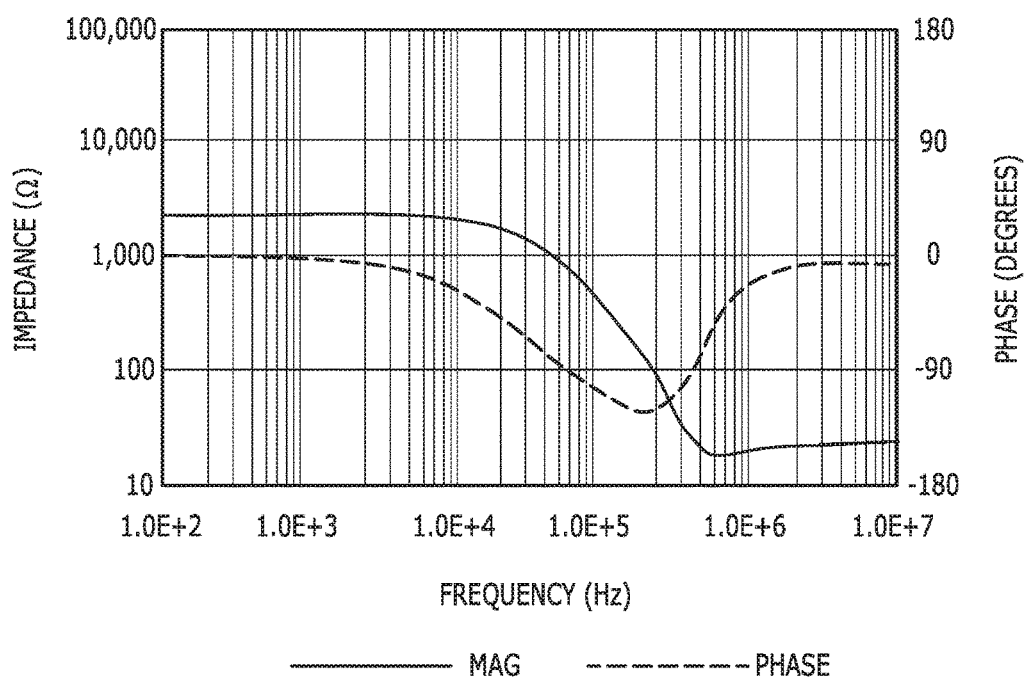
FIG. 3 is a graph showing loading impedance for the prior art amplifier circuit.
Figure 4:
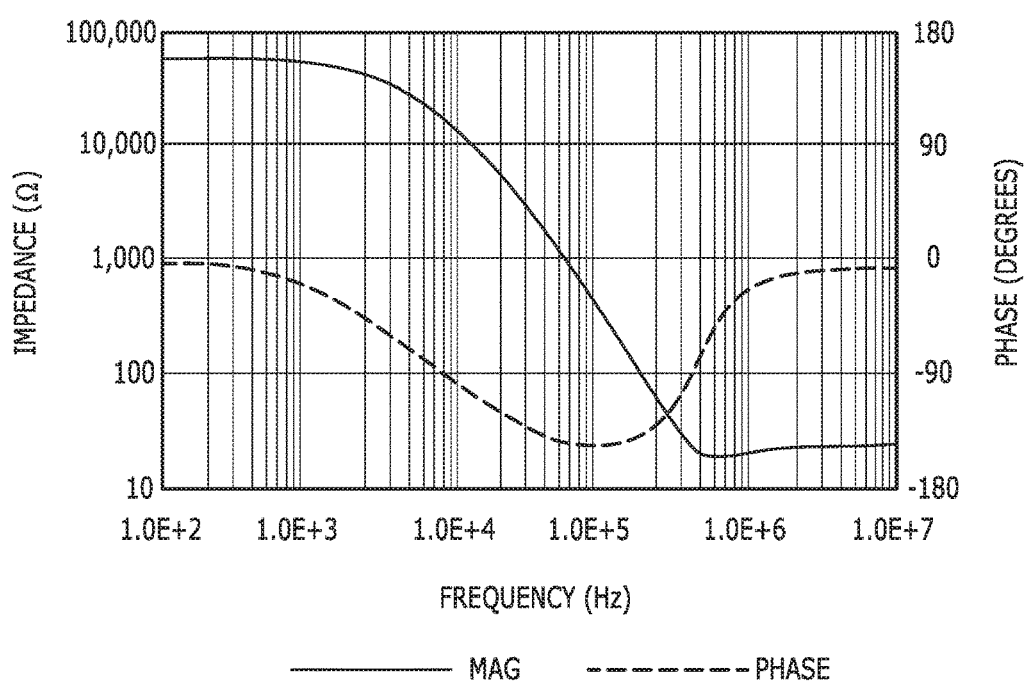
FIG. 4 is a graph showing loading impedance for the amplifier circuit of the present invention; and, FIG. 5 is a schematic of another alternative embodiment of the amplifier circuit.

The effect of the linear error current can be assessed by looking at the impedance that the feedforward network presents to the amplifier 102. The higher the impedance, the lower the linear error current will be. FIGS. 3 and 4 illustrate this. FIG. 3 shows the loading impedance for a particular instance of the configuration shown in FIG. 1, whereas FIG. 4 shows the impedance for the configuration of FIG. 2. It can be seen that the impedance in the audio band is greatly increased.

Figure 5:
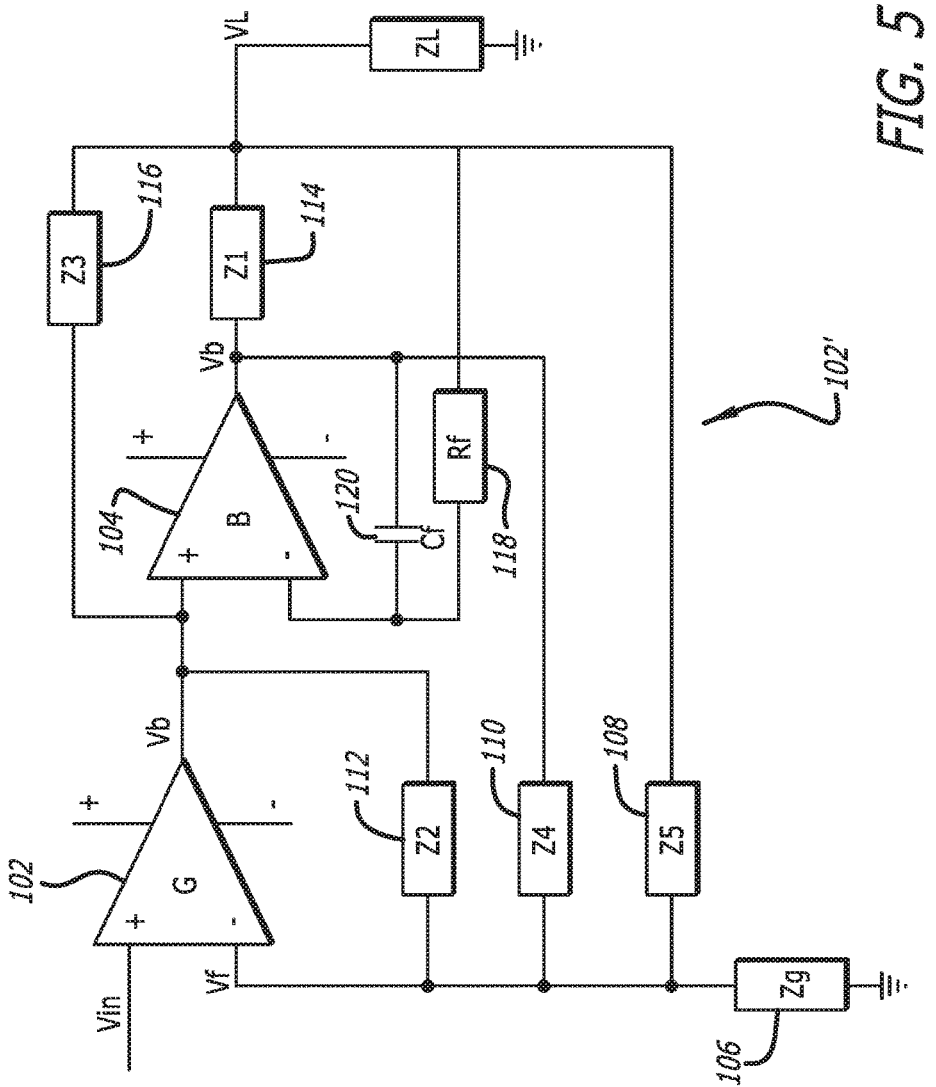

The introduction of the modified feedback loop around amplifier 104 shown in FIG. 2 may complicate the design of the various feedback loops depending on the characteristics of the amplifier 104. A further degree of control over the design may be accomplished by splitting the take-off points for the feedback around amplifier 104 as shown in the alternate embodiment of the amplifier circuit 102' depicted in FIG. 5. The amplifier circuit 102' includes a resistor 118 ($R_f$) and a capacitor 120 ($C_f$). Also depicted is a load 122 ($R_L$). At low frequencies, the feedback is dominated by the resistive path from the load 122 via resistor $R_f$, thereby reducing the linear error current as originally intended. At high frequencies the feedback is dominated by the capacitive feedback path via $C_f$, thus reducing the effect of any reactive load impedance at the output of the amplifier while simultaneously adding an extra degree of control over the effective impedance presented to the amplifier 102.

The '355 patent describes the connection of impedance elements $Z_1$ to $Z_4$ such that they consist of linear circuit elements including resistors, capacitors, or network combinations thereof. One combination detailed in the specification of the '355 patent is that $Z_1$ is a resistor, $Z_2$ is a capacitor, $Z_3$ is a parallel resistor and capacitor and $Z_4$ is a series resistor and capacitor. An additional feedback path can be added via $Z_5$ without upsetting the bridge balance. In this case, this feedback path may comprise a low pass filter. This is not a limiting combination however. For instance, $Z_3$ may comprise a capacitor without a parallel resistor, in which case $Z_4$ reduces to a resistor and $Z_5$ is not then required to act as a filter. In such a case, the balance of feedback around the internal feedback loop (where the feedback is taken from the output of amplifier B) and the external feedback loop (where the feedback is taken from overall output $V_L$) can be altered, such that the internal loop feedback is reduced in magnitude compared to the external feedback loop. The bridge has to be rebalanced when this modification is made to ensure distortion cancellation still occurs correctly. However, once accomplished, such an arrangement can provide for a wideband constant reduction in amplifier output impedance with the operational bandwidth of the amplifier as opposed to the frequency dependent output impedance reduction of the previously described arrangement.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An amplifier circuit, comprising:
    a first amplifier that has a first input that receives an input signal, a second input and an output;
    a second amplifier that has a first input that is coupled to said output of said first amplifier, a second input and an output;
    a first impedance network Z1 coupled to a load and has an output connected to said second input of said second amplifier;
    a second impedance Z2 connected to said output of said first amplifier and said second input of said first amplifier;
    a third impedance Z3 connected to said output of said first amplifier and said load; and
    a fourth impedance Z4 connected to said output of said second amplifier and said second input of said first amplifier.

2. The amplifier circuit of claim 1, further comprising a resistor in parallel with a capacitor, said resistor and said capacitor being connected to said output of said second amplifier and said second input of said second amplifier.

3. The amplifier circuit of claim 1, wherein said first Z1, second Z2, third Z3 and fourth Z4 impedance networks have values such that Z1×Z2=Z3×Z4.

4. The amplifier circuit of claim 1, wherein said first Z1, second Z2, third Z3 and fourth Z4 impedance networks consist of resistors, capacitors or network combinations of resistors and capacitors.

5. The amplifier circuit of claim 1, further comprising a fifth impedance network Z5 that is connected to the said load and said second input of said first amplifier.

* * * * *